US007205643B2

(12) United States Patent
Smith

(10) Patent No.: US 7,205,643 B2
(45) Date of Patent: Apr. 17, 2007

(54) STRAY FIELD SHIELDING STRUCTURE FOR SEMICONDUCTORS

(76) Inventor: David Walter Smith, 10250 E. Mountain View Unit220, Scottsdale, AZ (US) 85258

( * ) Notice: Subject to any disclaimer, the term of this patent is extended or adjusted under 35 U.S.C. 154(b) by 144 days.

(21) Appl. No.: 11/075,250

(22) Filed: Mar. 8, 2005

(65) Prior Publication Data

US 2006/0205177 A1 Sep. 14, 2006

(51) Int. Cl.
*H01L 21/44* (2006.01)

(52) U.S. Cl. ........................... 257/681; 257/659; 438/2

(58) Field of Classification Search ................ 257/659, 257/660, 681, 692; 438/2, 3
See application file for complete search history.

(56) References Cited

U.S. PATENT DOCUMENTS 6,888,184 B1 * 5/2005 Shi et al. .................... 257/293
2006/0043539 A1 * 3/2006 Thomas et al. ............. 257/659

* cited by examiner

*Primary Examiner*—Phuc T. Dang
(74) *Attorney, Agent, or Firm*—John B. Sowell

(57) ABSTRACT

A stray field shielding structure for die attaching onto a magnetic random access memory chip or to other chips to prevent loss of memory due to magnetic fields or radiation is made by a method which provides a thick layer of magnetic material which is precise in its dimensions and adapted for placement on individual die by existing pick and place machines and die attach bonders. The magnetic shielding material is cut to a desired size by etching to remove all burrs and debris and is then attached only to good die using a die attach film of thermoset plastic or a gob of epoxy adhesive.

7 Claims, 4 Drawing Sheets

31
27
23A
28
29

STRAY FIELD SHIELDING STRUCTURE FOR SEMICONDUCTORS

BACKGROUND OF THE INVENTION

1. Field of the Invention

The present invention relates to semiconductors as used in computers and digital cameras, etc. More particularly, the present invention relates to an improvement for memory chips and radiation resistant semiconductors.

2. Description of the Prior Art

Heretofore, various types of memory were made using semiconductor manufacturing techniques. The object of these devices or chips was to provide a large number of cells or bits at an ever decreasing price. Some such memory devices required constant refresh electrical signals to maintain the stored data such as in dynamic random access memory (DRAM). Other devices such as FLASH memory did not require refresh signals (non-volatile) but did require higher voltage and power.

As computers, video games and digital cameras required faster logic execution, they have been slowed by the fact that the memory chips were much slower than the logic gates on the logic chip. It has been suggested that memory chips could be made faster by making the memory chips smaller. Intel makes FLASH memory using state of the art design rule technology, now below 0.18 microns. However, such FLASH memory is external to the operating system and requires access time similar to hard disc or hard drive systems to reach the memory.

It would be desirable to provide a single memory solution for multiple memory options in a single memory chip. The one chip would be both memory and logic enabling it to directly access the microprocessor or computer without excessive delays caused by access delay caused by remote locations of the memory.

SUMMARY OF THE INVENTION

It is a primary object of the present invention to provide an improved non-volatile memory chip that uses the same CMOS technology as in computer chips.

It is a primary object of the present invention to provide both a method and means for placing non-volatile memory chips directly on computer chips.

It is a principal object of the present invention to provide an improved, cheap, reliable, non-volatile memory for digital camera cards and computer memory cards or memory sticks.

It is a primary object of the present invention to provide a method of making a stray field shielding structure for semiconductor chips.

It is a primary object of the present invention to provide a method for making non-volatile memory chips using fewer steps than in the prior art.

It is a primary object of the present invention to provide means for achieving higher yield device structures at lower cost.

It is a primary object of the present invention to provide a method and means of making high yield, non-volatile chips using known CMOS semiconductor equipment and technology.

It is a primary object of the present invention to provide an improved magnetic memory semiconductor that uses less power and lower voltages than FLASH memory.

It is a primary object of the present invention to provide a stray field shielding structure that may be attached to memory chips that are provided with wire bonds and/or surface mounted bumps or pads.

It is a primary object of the present invention to provide a stray field shielding structure that may be attached to semiconductor chips that are mounted on lead frames or carriers before or after they are wire bonded.

It is a principal object of the present invention to provide a stray field shielding structure for shielding embedded or integrated memory that is made by the same process technology on the same chip as a computer.

It is a principal object of the present invention to provide an improved magnetoresistive random access memory (MRAM) memory structure made with the same CMOS technology as high speed computer chips, thus, enabling a complete system to be made on one chip which reduces the cost of the memory chip and increases the access speed to the memory.

Accordingly, through these and other objects of the present invention, there is provided a stray field shielding structure comprising magnetic field conductive material adapted to be attached to memory chips to prevent data loss due to stray magnetic fields. A layer of die attach bonding material may be provided on the attaching surface of the magnetic field conductive material or the die. The magnetic shielding material is cut to a desired size by etching in a manner that removes all burrs and avoids creation of debris and yet increases yield and lowers the cost.

DETAILED DESCRIPTION OF THE PREFERRED EMBODIMENTS

For the purpose of this description random access memory (RAM) shall mean a volatile read-write memory. RAM differs from read-only memory (ROM) which is also volatile and the latest versions are random accessible unlike the earlier versions.

There are many different types of RAM including static RAM or SRAM and dynamic RAM or DRAM. SRAM is faster than DRAM; however, SRAM employs four to six transistors, thus, takes up more space on a silicon chip and is proportionally more expensive. DRAM requires a refresh circuit to hold data. SRAM employs a capacitor and one transistor used to read the charge (1) or no charge (0). The capacitor only holds its charge for a short period of time, but will hold its charge as long as power is ON. Thus, SRAM and DRAM are volatile in nature, and when power is OFF the data is lost.

For the reasons stated above SRAM is employed in level 1 and level 2 cache memories and on a chip external to the processor chips (PCs). The cheaper DRAM is employed for system memory even though it, too, is external to the PC and slower than SRAM.

Motorola has developed and patented a Magnetoresistive Random Access Memory (MRAM) chip which has the potential to be a "universal memory" in that it may have all the advantages of SRAM and DRAM if it could be made nonvolatile. The memory cells are based on a single transistor and a single magnetic tunnel junction (MTJ), and analogous to a capacitor in the DRAM losing its orientation, not due to leakage but to stray fields. The present invention is capable of making an MRAM non-volatile.

Figure 1:
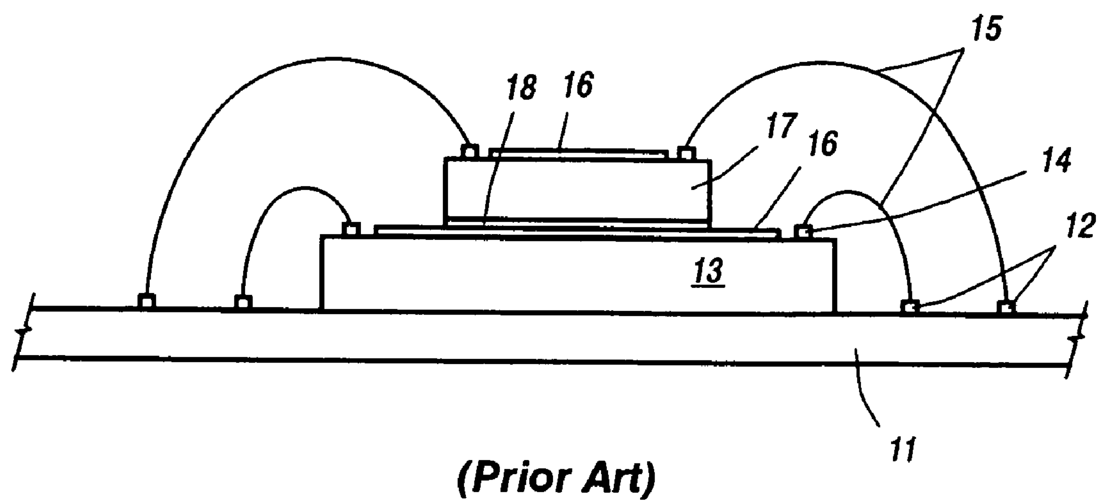
FIG. 1 is an enlarged section in elevation of prior art wire bonded stacked semiconductor chips on a lead frame.

Refer now to FIG. 1 showing an enlarged section in elevation of prior art wire bonded stacked semiconductor chips shown on a lead frame. It will be understood that other chips will be on the lead frame which is designed to move precisely through a fine wire ball bonder. The lead frame 11 has outer leads (not shown) with bonding points 12. The die or semiconductor 13 has lead out pads 14 which are bonded by fine wire such as gold wires 15 to the die 13 and the lead frame 11. The bottom die 13 is shown having a passivation layer 16 usually of glass onto which a second die 17 is stacked and held by an adhesive layer 18 which may be a die attach film or a glob of adhesive preferably epoxy adhesive. It is believed that the FIG. 1 stacked die is known.

Figure 2:
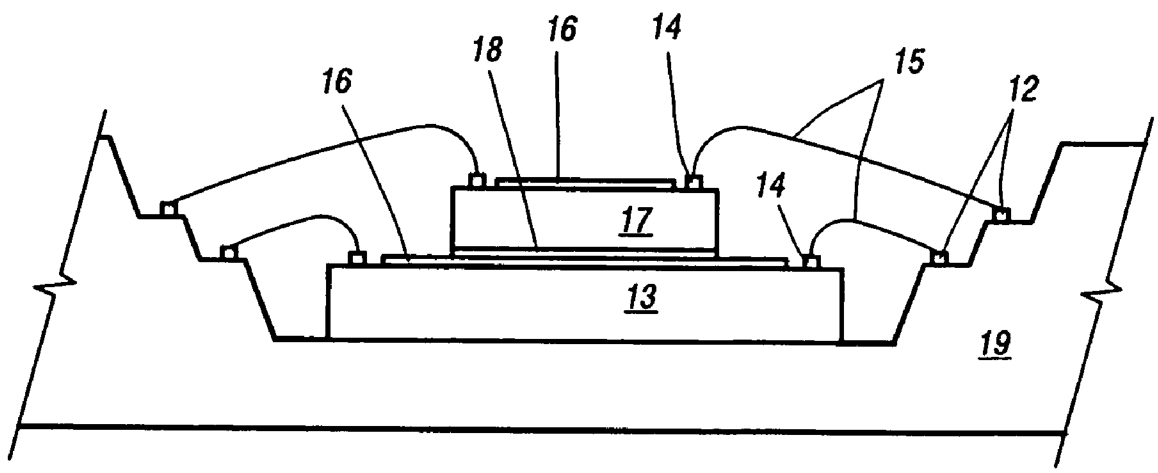
FIG. 2 is an enlarged section in elevation of prior art wire bonded stacked semiconductor chips on a ceramic carrier package.

Refer now to FIG. 2 showing an enlarged section in elevation of stacked die 13 and 17 similar to that shown in FIG. 1. However, the stacked die are shown placed into a ceramic carrier package 19. Otherwise, the technology is similar to that shown in FIG. 1 and is numbered the same.

Figure 3:
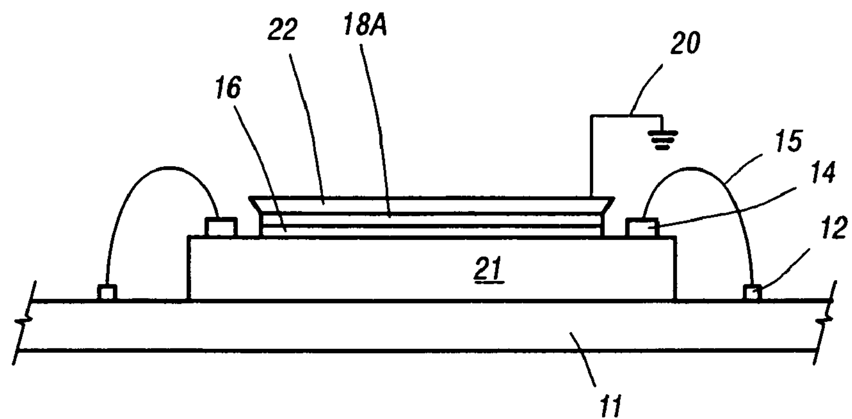
FIG. 3 is an enlarged section in elevation of a die or memory chip having a stray field shielding structure bonded over the die to eliminate disruptions of stored data.

Refer now to FIG. 3 showing an enlarged section in elevation of the present invention die 21 or memory chip 21 having a stray field shielding structure 22 bonded over the die passivation layer 16 to eliminate stray field disruptions of stored data in the die 21. The stray field magnetic material 22 and the special die attached film or adhesive 18A comprises a unique stray field shielding structure which may be attached by a die bonder to any die 21, however, to be effective the magnetic field structure 22 must be very precise in its dimensions so as not to touch the lead out pads 14 or the connecting fragile wires 15. In the preferred embodiment of the present invention the die 21 comprises magnetoresistive random access memory chips (MRAM) which were designed to be non-volatile but found to be subject to disruptions and loss of data due to stray fields. The novel stray field shielding structure shown in FIG. 3 isolates the die 21 so that the data stored in the magnetic layers of the die 21 is not disrupted and can be read numerous times without loss of data. Ground 20 can be optional.

Figure 4:
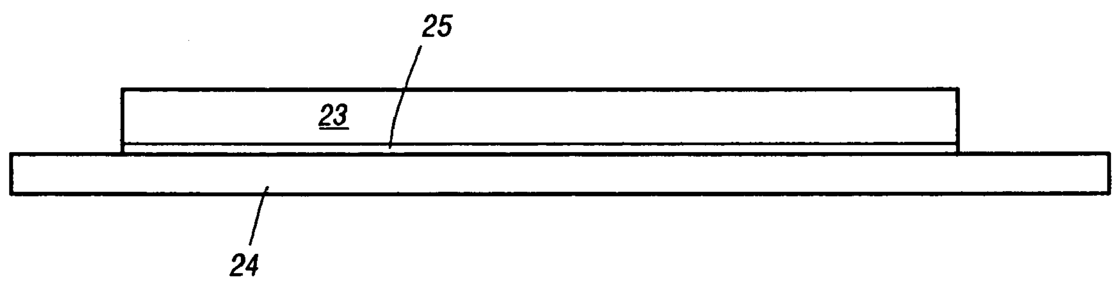
FIG. 4 is a conventional size section in elevation of a wafer size piece of magnetic shielding material that is bonded onto a host, substrate support or panel.

Refer now to FIG. 4 showing a wafer larger in size than the die and shielding structure 22, 18A shown in FIG. 3. The magnetic shield material 23 is preferably wafer size and could be bonded onto a wafer (not shown) as will be explained hereinafter. A preferred method involves bonding the large sheet of shield material to a host or substrate 24 by conventional semiconductor process means using a die attach film 25(DAF), thus, the process of using the stray field shielding structure will be compatible with known and existing semiconductor processes. In the preferred embodiment of the present invention it has been found that the thickness of the shielding material cannot easily be made by any known depositing technique because the thickness needs to be a minimum of 3 up to 8 mils and cannot be made by conventional semiconductor processes. In the preferred embodiment of the present invention the host or carrier substrate 24 is a flexible kapton sheet of approximately one one-thousandths of an inch in thickness and is used because of its known stability and non-hydroscopic properties. A preferred method of attaching the shielding material 23 to the kapton 24 is to use dry adhesive with time, pressure and temperature in a vacuum autoclave.

Figure 5:
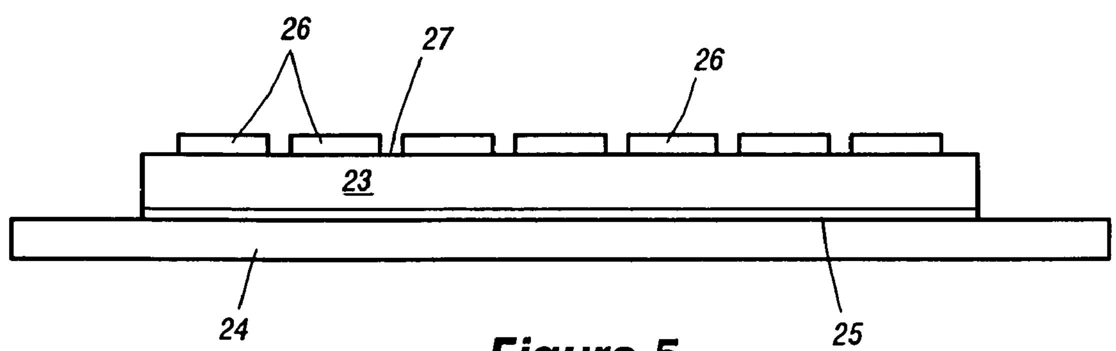
FIG. 5 is a section in elevation of the magnetic shielding material shown in FIG. 4 after receiving a pattern of photo-resist material which defines a rectangular array of individual field shielding structures beneath.

Refer now to FIG. 5 showing a section in elevation of the shielding material 23 that is shown in FIG. 4 after it has received a pattern of photo-resist material 26 that has been deposited and etched to provide a rectangular array of a plurality of shielding structures as will be explained hereinafter. The space between individual photoresist patterns is known as a street 27 in the semiconductor industry. It is desirable to remove the material under the street and not the magnetic material 23 under the pattern 26. The structure 22, 18A must be made very precise and further requires placement and size tolerance under 10 microns. Therefore, the street 27 cannot be sawn with diamond saw blades as is common in the semiconductor industry for dicing wafers. Attempts to saw the street 27 between patterns 26 cannot be held to tolerances as close as 10 microns and produces debris and burrs which would destroy the electrical connections or result in imperfect shielding when placed on the die 21 as shown in FIG. 3. It will be understood that the die 21 are usually rectangular memory chips which may hold up to 4 megabytes of memory with the present technology and are up to a half inch on a side. With the present technology constantly reducing the size of the die 21, it is expected that the present memory die will multiply in size of memory by a factor of ten and reduce its physical size by a factor of fifty percent.

Figure 6:
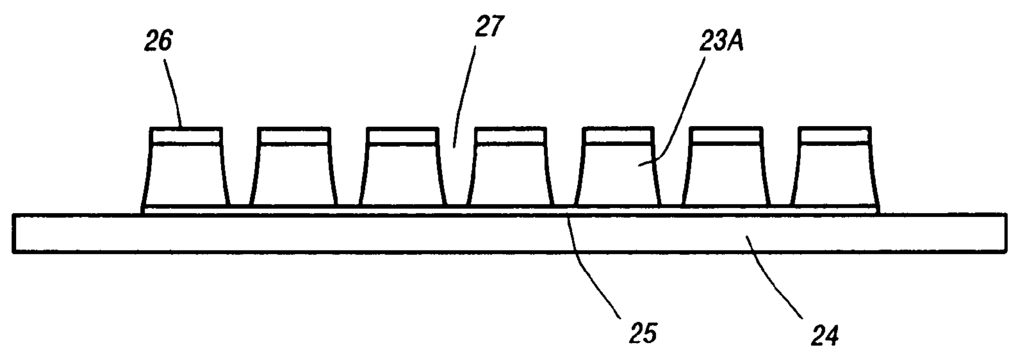
FIG. 6 is a section in elevation of the shielding material shown in FIG. 5 after being etched down to the adhesive film or die attach film (DAF) layer.

Refer now to FIG. 6 showing a section in elevation of the shielding material 23 in FIG. 5 after being etched down to the adhesive layer 25. It will be noted that the photo-resist pattern 26 has not been affected in size by the preferred acid etching technique which is a spray technique. However, as the acid etches away portions of the stray field shielding material 23A there is a slight undercut under the pattern 26 and the material tapers downward into the street area 27. Since the individual blocks of shielding material 23A are precisely located on its carrier or substrate 24 they may be accurately transferred to a wafer film after removal of the photo-resist 26 and its pattern.

Figure 7:
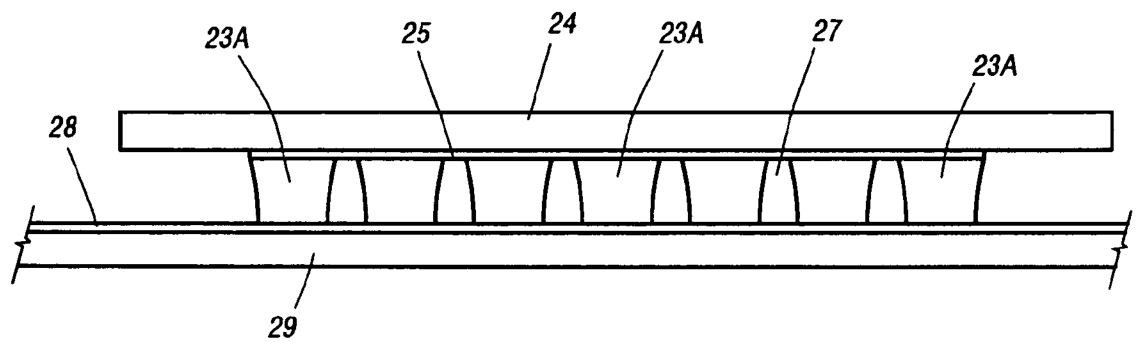
FIG. 7 is a section in elevation of the shielding material shown in FIG. 6 inverted and temporarily adhesive bonded to a die attach film (DAF) carrier on a flexible wafer film.

Refer now to FIG. 7 showing a section in elevation after removal of the photo-resist 26 and its pattern of material 23A inverted and temporarily adhesive bonded to a die attach film 28 which is carried on a flexible wafer film 29. Such processes are used in the semiconductor industry prior to die bonding or probing and transfer. Note that the stable film 24 is now the upper film or carrier and the magnetic material 23A is pointed downward with its pattern 26 removed and now attached to the die attach film 28 carried by the flexible wafer film 29. Note that even though the array of blocks of shielding material shown in FIG. 6 are turned upside down and transferred onto the flexible wafer film 29 which is usually stretched in a wafer frame (not shown), the individual blocks of material 23A are precisely located on the wafer film 29.

Figure 8:
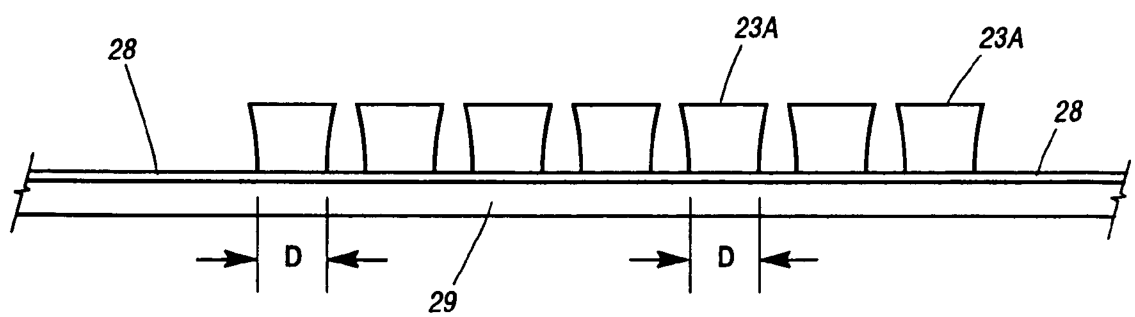
FIG. 8 is a section in elevation of the shielding material shown in FIG. 7 with the host, substrate support or upper panel removed.

Refer now to FIG. 8 showing a section in elevation of the shielding material shown in FIG. 7 with the host substrate or support 24 removed leaving an array of blocks of shielding material 23A attached by a die attach film 28 to the wafer film 29. Using present semiconductor technology for eight inch wafers, there are as many as one thousand blocks of magnetic shielding material 23A now on the wafer frame 29 and each of the dimensions D at the top of the stray field shielding material 23A is a precise dimension well within tolerance required. While the tolerance is now approximately ten microns when wafers move to the larger wafer size of ten to twelve inches the die 21 will be reduced in size and the tolerances can still be held below ten microns.

Figure 9:
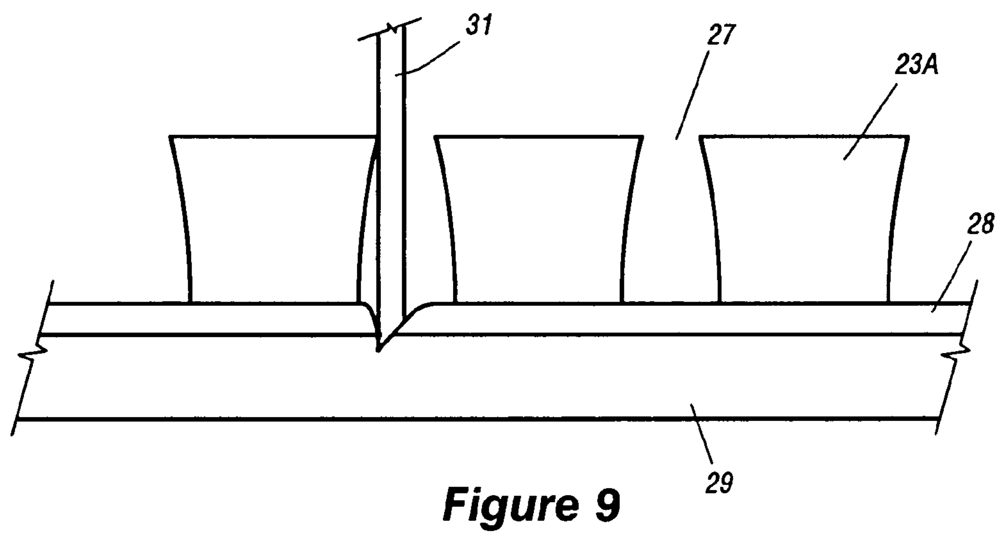
FIG. 9 is an enlarged section in elevation of the individual shielding structures shown in FIG. 8 being separated horizontally from each other by severing the die attach film layer (DAF) with a cutting tool such as a razor.

Refer now to FIG. 9 showing an enlarged section in elevation of individual shielding structures or blocks 23A shown in FIG. 8 being separated horizontally from each other by the aforementioned street 27 and held precisely in place by the die attach film layer 28. There is shown a cutting tool 31 placed precisely between two of the magnetic material shielding structures 23A and the street 28 which extends down through the die attach film 28 and preferably into the supporting wafer film 29. In the preferred embodiment of the present invention, the cutting tool 31 was a specially made circular cutting tool which could be fitted onto a commercially available dicing saw so that the exact depth could be controlled and the cutting tool could be rotated like a pizza cutter or could be dragged through the street 27 and continually indexed slightly so as to maintain a very sharp edge or even spun and rotated at a high RPM similar to a dicing saw blade. It was found by the developers of the present invention that the cutting tool 31 when drug or rotated like a pizza cutter would not remove any debris from the die attach film 28 or the wafer film 29. Thus, it will be noted by using a preferred embodiment spray etching technique there are no burrs on the blocks of magnetic shielding material 23A and there is no debris created when they are separated one from the other on the wafer film 29.

Figure 10:
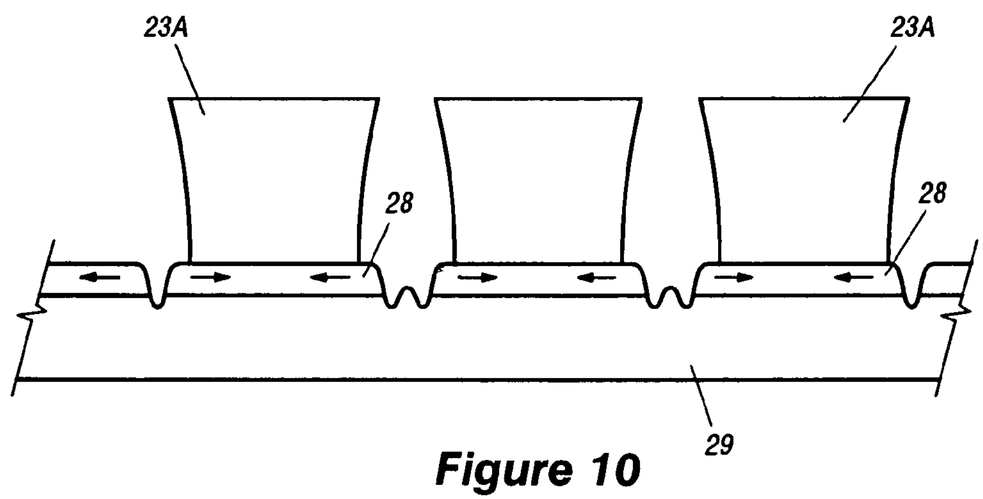
FIG. 10 is the same shielding structure as shown in FIG. 9 after the shielding structures are isolated one from the other.

Refer now to FIG. 10 showing the same structure as shown in FIG. 9 after the shielding structures 22A are isolated from each other and the shape of the film 28 and film 29 is approximately as shown. The arrows on the die attach film 28 are intended to show how the die attach material is deformed by the preferred razor type blade cutting tool. The process of cutting is part cut and part extrusion which leaves the preferred embodiment structure 23A, 28 ready for removal by a pick and place machine or a die bonder or die attach machine. Dual and single cuts are shown.

Figure 11:
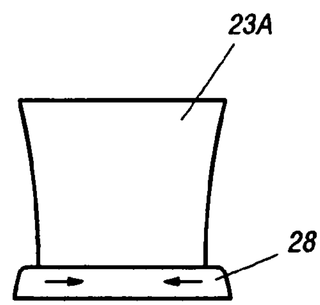
FIG. 11 is an enlarged section in elevation of an individual shielding structure ready for die bonding or pick and place placement over a memory chip.

Refer now to FIG. 11 showing the preferred embodiment stray field shielding material structure 23A, 28 as a component ready to be precisely attached to a completed inspected die 21 using precision guided instrument placement systems. It is known that the state of the art optical placement systems can locate the stray field shielding structure 23A, 28 shown in FIG. 11 onto an existing inspected die with accuracy below six microns.

Having explained a preferred embodiment of the present invention, it will now be understood that the inverted burr free shielding structures 23A, 28 shown in FIG. 8 could well have been placed directly onto die like 21 in wafer form and then the wafer diced or sawn. The die in wafer form could then be mounted on NITTO™ blue tape or on UV dry adhesive tape. In the first place, the exact precision of the optical placement system of a die bonder is greater than the precision of location of the individual die structures on the wafer 29; thus, the process that is preferred and can be used in the next generation when the memory die chips become smaller. There is a distinct advantage in placing the structures 23A, 28 shown in FIG. 11 directly onto a wire bonded die 21. After the die 21 are placed in their package, they may be completely tested and only those die that are perfect need to be shielded with the novel shielding material shown in FIG. 11. Using the present technique tolerances are held so close with the semiconductor processing equipment used that it is possible to wire bond good die and subsequently inspect the good die for good wire bonding and then apply the shielding material, thus, increasing the yield to one hundred percent.

Having explained the technique for producing shielding structures 23A, 28 and placing them on good die, it will now be apparent that complete computer chips can be made using CMOS technology which incorporates on the chip a large amount of MRAM memory which can be shielded on the chip as one system. The advantage being that you do not have to now proceed off chip to FLASH memory or hard disc in order to increase the access speed because the memory is now part of the computer chip. It is now apparent that MRAM chips can also be bump bonded or flip chip bonded onto CP chips or they can be integrated into CP chips.

Having explained a preferred embodiment shown in FIGS. 6 to 11 using a die attach film 28, it is possible to employ a modification to the structure 23A,28. When a wafer of die 21 is mounted on a NITTO™ or blue tape or UV dry adhesive tape as used in die bonding operations, it is possible to place the inverted burr free shielding structures 23A directly onto individual die 21 in wafer form before the wafer is sawn or diced. The street 27 is etched and more narrow than a street or space between die 21 on a wafer (not shown). When placing shielding structures 23A on an unsawn wafer it is best to replace the die attach film 28 with individual gobs of adhesive placed on the individual die 21 of the wafer by using a dispensing device or screen printing all die 21 on a wafer using a screen printer with appropriate adhesive. This will avoid any problem of sawing into a DAF adhesive layer.

To make the modification of replacing the die attach film 28 shown with a gob of epoxy adhesive it is preferred that the array of shielding material 23A shown in FIG. 6 have the photo resist material 26 removed and the array of shielding material inverted and transferred to a NITTO™ type tape which has a dry adhesive layer in place of tape 28. This is easily done by placing the NITTO™ tape on a vacuum chuck and peeling away the carrier 24 and its adhesive 25 shown in FIGS. 6 and 7.

Explained differently, the carrier 28,29 shown in FIG. 8 would be the equivalent of having an array of shielding material 23A on a NITTO™ tape enabling them to be die bonded onto a wafer of die 21 or onto individual previously wire bonded die 21 using a gob of adhesive to secure the shielding structure 23A to the die 21.

What is claimed is:

1. A stray field shielding structure for die attaching onto a magnetorestrictive random access memory (MRAM) chip to prevent loss of memory due magnetic stray fields comprising:

a layer of individual magnetic shielding material adapted for placement by pick and place machines and/or die bonders, said magnetic shielding material being cut to a precise desired size by etching to remove all burrs and debris in the streets between blocks of shielding material, and an attaching layer for bonding said magnetic material to individual die.

2. A stray field shielding structure as set forth in claim 1 wherein said streets between magnetic material blocks is acid or plasma etched to remove all burrs and maintain precise dimensions.

3. A stray field shielding structure for attachment to magnetic random access memory chips as set forth in claim 1 wherein said magnetic shielding material comprises nickel or nickel alloy.

4. A stray field shielding structure as set forth in claim 1 wherein said magnetic shield material further comprises a metal radiation shield.

5. A stray field shielding structure as set forth in claim 1 wherein said magnetic random access memory chip comprises a non-volatile magnetoresistive random access memory (MRAM).

6. A stray field shielding structure for die attaching onto an MRAM chip as set forth in claim 1 wherein said attaching layer comprises a polyimide die attach film (DAF).

7. A stray field shielding structure for die attaching onto MRAM chips as set forth in claim 1 wherein said layers of magnetic shielding material is three to eight one thousandths of an inch thick.

* * * * *

US007205643C1

(12) INTER PARTES REEXAMINATION CERTIFICATE (0364th)

United States Patent

Smith

(10) Number: US 7,205,643 C1

(45) Certificate Issued: Apr. 3, 2012

(54) STRAY FIELD SHIELDING STRUCTURE FOR SEMICONDUCTORS

(75) Inventor: David Walter Smith, Scottsdale, AZ (US)

(73) Assignee: Nexedge, LLC, Chicago, IL (US)

Reexamination Request:
No. 95/001,663, Jul. 15, 2011

Reexamination Certificate for:

| | |
|---|---|
| Patent No.: | **7,205,643** |
| Issued: | **Apr. 17, 2007** |
| Appl. No.: | **11/075,250** |
| Filed: | **Mar. 8, 2005** |

(51) Int. Cl.
*H01L 21/44* (2006.01)

(52) U.S. Cl. ................ 257/681; 257/659; 257/E23.114; 438/2

(58) Field of Classification Search ........................ None
See application file for complete search history.

(56) References Cited

To view the complete listing of prior art documents cited during the proceeding for Reexamination Control Number 95/001,663, please refer to the USPTO's public Patent Application Information Retrieval (PAIR) system under the Display References tab.

*Primary Examiner*—Erik Kielin

(57) ABSTRACT

A stray field shielding structure for die attaching onto a magnetic random access memory chip or to other chips to prevent loss of memory due to magnetic fields or radiation is made by a method which provides a thick layer of magnetic material which is precise in its dimensions and adapted for placement on individual die by existing pick and place machines and die attach bonders. The magnetic shielding material is cut to a desired size by etching to remove all burrs and debris and is then attached only to good die using a die attach film of thermoset plastic or a gob of epoxy adhesive.

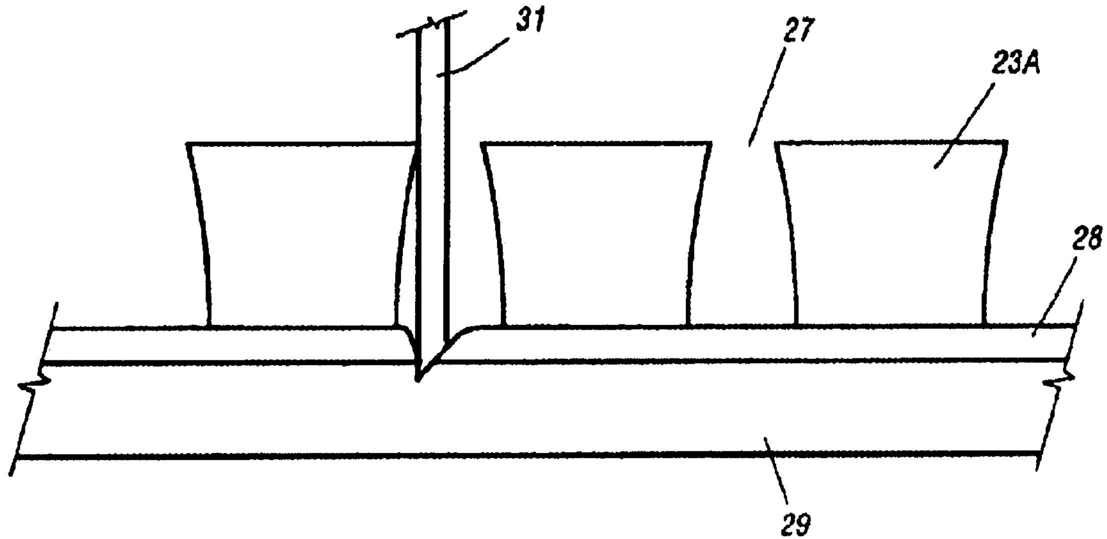

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-7 are cancelled.

* * * * *